United States Patent [19]

Kato

[11] Patent Number: 4,791,466
[45] Date of Patent: Dec. 13, 1988

[54] LINE SCANNER IMAGE SENSOR

[75] Inventor: Toshiaki Kato, Kanagawa, Japan

[73] Assignee: Fuji Electric Co., Ltd., Japan

[21] Appl. No.: 841,170

[22] Filed: Mar. 19, 1986

[30] Foreign Application Priority Data

Mar. 20, 1985 [JP] Japan .................................. 60-57006

[51] Int. Cl.⁴ ............................................ H01L 27/14
[52] U.S. Cl. ............................................ 357/30; 357/4
[58] Field of Search .................... 357/30 J, 30 Q, 2, 4, 357/45; 358/213; 250/211, 211 J

[56] References Cited

U.S. PATENT DOCUMENTS 4,167,806  9/1979  Kumurdjian ........................... 29/580
4,567,374  1/1986  Takenouchi et al. ................ 250/578
4,698,495 10/1987  Kajiwara .............................. 357/30

FOREIGN PATENT DOCUMENTS 0141172  6/1986  Japan ..................................... 357/30

Primary Examiner—William L. Sikes
Assistant Examiner—B. Randolph
Attorney, Agent, or Firm—Brumbaugh, Graves, Donohue & Raymond

[57] ABSTRACT

A line scanner compries a conductive film which has been patterned to define a plurality of electrodes, each with an attached lead, is covered with a layer of photosensitive a-silicon and the silicon in turn is covered with an insulating resin. The insulating film is patterned to open a linear window which exposes equal amounts of each electrode and attached lead and a common electrode overlies the resin and contacts the electrodes and leads through the window.

4 Claims, 2 Drawing Sheets

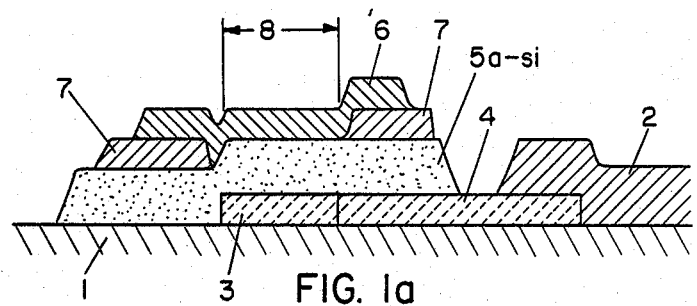
FIG. 1a
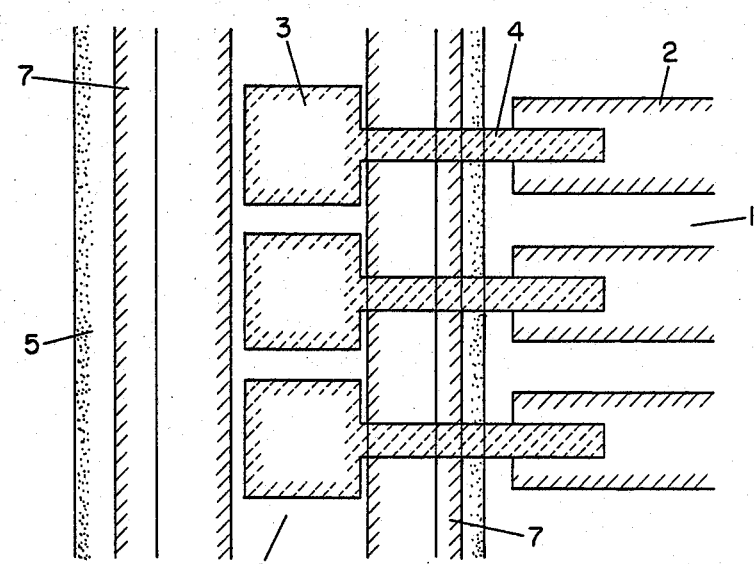
FIG. 1b
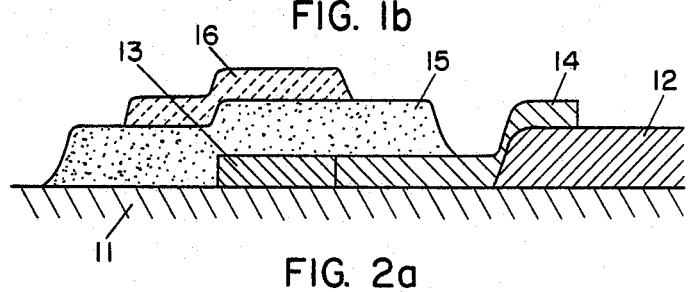
FIG. 2a
PRIOR ART
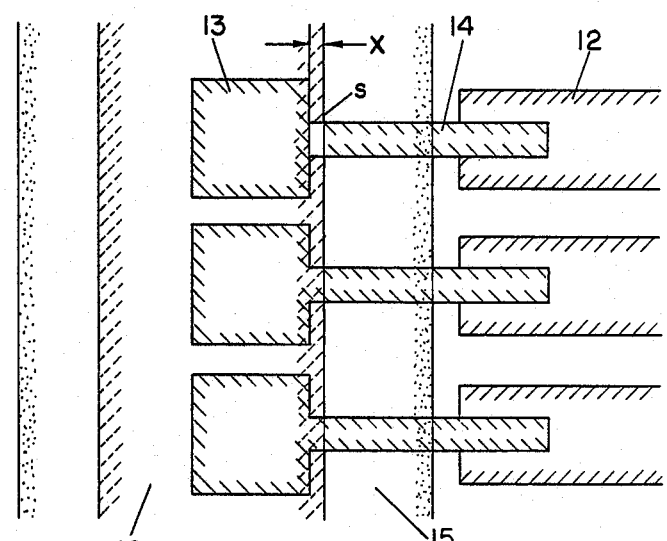

LINE SCANNER IMAGE SENSOR

FIELD OF THE INVENTION

The present invention relates to a contact-type image sensor which is useful, for example, in reading documents, sifting bills and other office automation tasks, and which has a plurality of light sensors arranged in a line to sequentially read an image line-by-line. Such a device may be described as a line scanner. The invention also relates to the process of forming such a line scanner.

BACKGROUND OF THE INVENTION

A typical conventional contact type image sensor which is applied to a facsimile document reading device will be explained hereinafter with reference to FIGS. 2(a) and (b), in which the regions shown in the cross-section in FIG. 2(a) with different forms of hatching are shown in the same framing pattern in the plan view of FIG. 2(b). In this conventional contact type image sensor, a gold film is attached on an insulating substrate 11 by means of screen process printing and successive baking, and is then processed by a photoetching method so as to form wires 12. A film of chromium is then deposited and patterned by photoetching such as to form individual electrodes 13 and leads 14. The leads 14 are formed such that they electrically connect the wires 12 to the electrodes 13. Subsequently, a film of intrinsic amorphous hydrogenated silicon (hereafter referred to as an "a-Si") 15 formed from silane gas mixed with hydrogen by means of plasma CVD method is selectively deposited through an appropriate mask in such a manner that the film 15 covers the individual electrodes 13. Finally, a film of indium-doped tin oxide (ITO) is deposited through a mask to form a common electrode 16 in such a manner that it overlies the individual electrodes 13. The light incident from a document to be read enters the sensor from the side of the common electrode 16 and penetrates the ITO film which is light transmissive.

In such an image sensor, however, since the common electrode 16 is formed by means of deposition through a mask and so results in low accuracy, the distance of overlap between the edge of the common electrode 16 and the edge of each individual electrode 13, shown by x in FIG. 2(b), tends to vary. Moreover, the portion of each lead 14 which underlies the common electrode 16, i.e., the unhatched area s is also involved in photoelectric conversion. As a consequence, even if the area of each individual electrode 13 is made constant, the photoelectric output of each photo detecting element may vary if the area s is changed. As a result, the capacity to read picture element may change in every element or in every lot, and this eventually leads to a reduction in the production yield.

In order to increase the dimensional accuracy of the common electrode 16, the ITO which has been selectively deposited may instead be patterned by the photoetching method so that it has a desired width. In that case, however, the etchant used may contact the a-Si film 15 and deteriorate the quality of the film. This also results in a decrease in the yield of production.

In view of the above-described problems, an object of the present invention is to provide a contact-type image sensor which has better uniformity in the photoelectric output of each light-receiving element and which can be readily manufactured with high production yield.

SUMMARY OF THE INVENTION

The foregoing object is achieved in accordance with the present invention by a line scanner including a plurality of individual electrodes arranged in a row on a substrate, a photoelectric conversion semiconductor film over the individual electrodes, and a common electrode formed to overlie the individual electrodes and to be spaced therefrom by the photoelectric conversion semiconductor film, wherein the improvement is characterized in that the common electrode is in contact with the semiconductor film only at a window having a predetermined dimension and opened in an insulating film which can be patterned by a process which does not deteriorate the semiconductive material. The object of the invention is achieved most effectively when the insulating resin film is a photosensitive resin and the window is opened by exposing and developing the resin film.

BRIEF DESCRIPTION OF THE DRAWING

FIGS. 1(a) and (b) are a sectional view and a plan view, respectively, of a first embodiment of the present invention;

FIGS. 2(a) and (b) are a sectional view and a plan view, respectively, of a prior art image sensor.

DESCRIPTION OF THE INVENTION

Figure 3A:
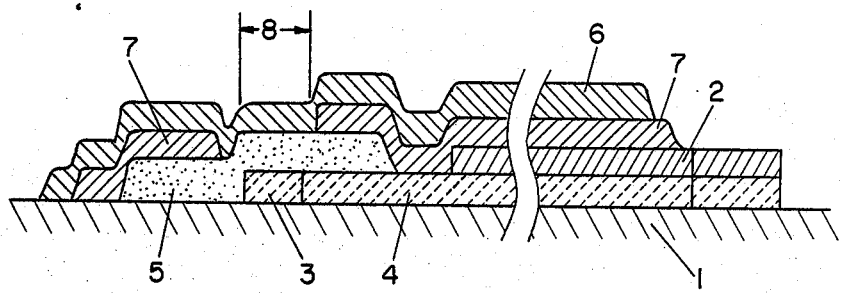
FIGS. 3(a) and (b) are a sectional view and a plan view, respectively, of a second embodiment of the present invention.

Referring to FIGS. 1(a) and (b) which show a first embodiment of the invention in the same manner as is shown in FIGS. 2(a) and (b) a film of ITO of a thickness of 700 Å is deposited on a transparent glass plate 1 which is employed as a substrate. The attached film is then patterned by photoetching to form individual square electrodes 3 with a relatively large size of 100 $\mu$m $\times$ 100 $\mu$m as well as individual elongated narrower leads 4. Subsequently, films of chromium and nickel are deposited to thicknesses of 1000 Å and 5000 Å, respectively, in that order, and a plated film of gold of 2000 Å thickness is deposited thereover. These layers of metals are then patterned by photoetching such as to form individual wires 2, one for each lead 4, as best seen in FIG. 1(b), for making an electrical connection to the free ends of the leads.

Subsequently, a film of intrinsic a-Si 5 of a micron thickness is deposited by the known plasma chemical vapor deposition process from silane gas which is diluted with hydrogen. The a-Si film 5 is formed through an appropriate mask in such a manner that it covers and overlaps the individual electrodes 3. Then, a negative type photosensitive polyimide resin is applied to a thickness of 50 $\mu$m by employing a spin coater, is pre-baked for 90 minutes at a temperature of 80° C., is exposed to the light through a photomask and developed, and is post-baked for 30 minutes at a temperature of 180° C. The photomask being used represents a linear pattern of 120 $\mu$m width. The photomask is positioned so that it overlies and slightly overlaps, the individual electrodes 3 though spaced by the a-Si film, before exposure. In consequence, a pattern of insulating film 7 is formed such that it covers the a-Si film 5, except along a linearly-shaped window 8, over the individual electrodes 3. Finally, a layer of aluminum of 1000 Å thickness and a layer of titanium of 3000 Å thickness are selectively deposited in turn through a mask having a pattern which allows the entire window 8 to be covered by the metals, thereby to form the common electrode 6 to the film 5.

In the thus-manufactured image sensor, since the a-Si film does not contact an acid etchant during the manufacture, the characteristics of the film are not deteriorated. As a consequence, I have realized line scanners in which the variability of current between individual sensors was no greater than ±10% under typical operating conditions.

FIGS. 3(a) and (b) show a second embodiment of the present invention, in which like reference numerals designate the parts which correspond to those of FIGS. 1(a) and (b). In this embodiment, the image sensor has the individual electrodes 3 and the leads 4 which are patterned from an ITO film on the transparent glass substrate 1 in the same manner as in the first embodiment. The substrate and the patterned film are then masked by a masking tape, and films of nickel and gold are coated thereon to thicknesses of 5000 Å and 2000 Å, respectively, by electroless plating. The nickel and gold which were attached on the glass substrate 1 are then scribed by a scriber to form the wires 2.

Figure 3B:
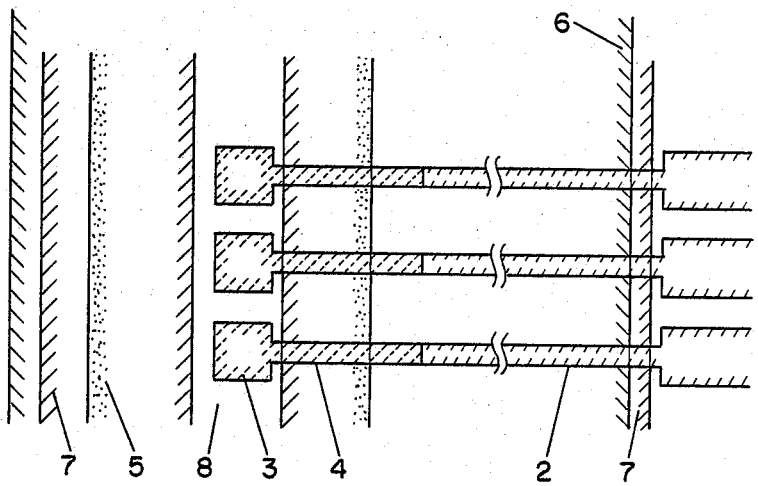

As seen in FIG. 3(b), each wire 2 includes an elongated narrow strip and an enlarged contact pad end region and each makes electrical contact with an individual lead 4 to an individual electrode 3, as in the previous embodiment. The enlarged ends facilitate connection of the scanner into the measuring circuits.

After the masking tape is peeled off and the surface of the patterned ITO film cleaned, the a-Si film 5 is formed in such a manner that it covers and overlaps the electrodes 3 and portions of leads 4. Subsequently, the photosensitive polyimide resin film is formed to a thickness of 30 μm by screen process printing, is pre-baked for 120 minutes at a temperature of 80° C., is exposed and developed through a linear mask having a pattern of 120 μm width, and is post-baked for 60 minutes at a temperature of 180° C. such as to form the insulating film 7 having the linearly-shaped window 8, as in the first embodiment. Finally, an epoxy conductive resin including fine particles of carbon and silver is deposited to a thickness of 50 μm by means of screen process printing in such a manner that it covers the window 8 formed in the polyimide resin film 7 to form the common electrode 6 contacting the a-Si film 5. Moreover, as seen in FIG. 3(a), this electrode 6 extends over the narrow elongated portions of the wires 2 leaving essentially exposed only the enlarged end pads.

The image sensor manufactured in the second embodiment is highly reliable, showing results in terms of the photoelectric outputs of the elements and in the variability among these outputs, which were similar in excellence to those obtained with the sensor manufactured according to the first embodiment. Moreover, the image sensor of this type remained undeteriorated after 1000 hours of moisture resistance testing conducted under conditions of 50° C. and 95% relative humidity. Since the conducting resin constituting the common electrode 6 extends over the wires 2 which are insulated by the insulating film 7, it is also possible effectively to shield the wires from electromagnetic waves. The electrolessly plated film of Ni has the characteristic that it attaches readily to the ITO but not to the glass. This characteristic is utilized by this method of image sensor manufacture, in which the films of Ni and Au are electrolessly plated after the individual electrodes 3 and the leads 4 have been integrally formed from ITO, and the Ni and Au which have been coated on the glass substrate are then scribed. In consequence, the number of photoetching processes employed during deposition can be reduced compared with the first embodiment, thereby reducing the production cost.

In the two embodiments described, the light irradiated from a document to be read enters the sensor through the glass substrate. The present invention, however, may also be applied to an image sensor in which the light enters the sensor from the side thereof which is opposite to the substrate. In this better case, the individual electrodes 3 and the leads 4 which are formed from light-transmissive ITO in the first describe embodiments, for example, are formed from a film of Cr, while the common electrode 6 on the a-Si film and insulating film 7 is formed from light-transmissive ITO.

In the above-described embodiments, the insulating film 7 on the photoelectric conversion semiconductor film 5 is formed by patterning a photosensitive polyimide film. A polymeric film, such as non-photosensitive polyimide film, may alternatively be formed to the desired pattern by known photolithography techniques. In that case, the exposed polymeric film is removed by a solvent, and therefore the quality of the insulating film is not deteriorated.

It will be appreciated that various other modifications may be devised in the specific embodiments which were described as examples of the invention.

Basically, in an image sensor according to the present invention, an insulating film having a window of a predetermined dimension is interposed between the common electrode formed over the photoelectric conversion semiconductor film and the semiconductor film. In consequence, the area of each light-receiving element which is effective for photoelectric conversion of the received light is determine by the dimensional accuracy of an insulating film which is patterned by means of photo processing which does not deteriorate the quality of the semiconductor film. Therefore, it is possible to better maintain the uniformity of the effective area, and thereby the photoelectric output of each element.

I claim:

1. A linear scanner comprising:
   an insulating substrate;
   a plurality of individual electrodes, each spaced apart in a linear row, disposed on the insulating substrate;
   a plurality of leads, attached to respective ones of the individual electrodes;
   a plurality of wires connected to respective ones of the plurality of leads;
   a layer of photosensitive semiconductive material overlaying the plurality of individual electrodes;
   an insulating film overlying the layer of photosensitive semiconductive material and the individual electrodes, said insulating film having a linear window which is positioned to expose essentially only a region of the photosensitive semiconductive material layer directly overlying the plurality of individual electrodes, and being substantially coextensive therewith; and
   a common electrode layer overlying the insulating film, overlapping the linear window therein and contacting the layer of photosensitive semiconductive material through the linear window.

2. A linear scanner in accordance with claim 1 in which the substrate is light transmissive.

3. A linear scanner in accordance with claim 1 in which the insulating film is of a photosensitve resin which can be patterned by photolithography.

4. A linear scanner in accordance with claim 1 in which the plurality of individua; electrodes are of indium-doped tin oxide, the substrate is of glass, and the wires are formed of electrolessly plated nickel and gold.

* * * * *